Figure 1:
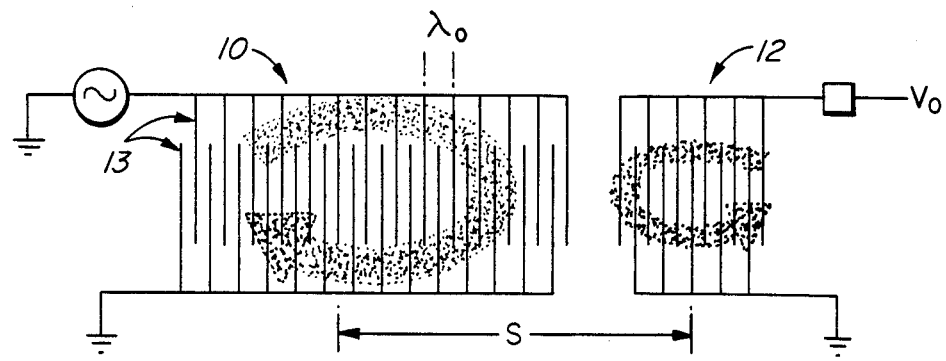

United States Patent [19]

Este et al.

[11] Patent Number: 4,539,502
[45] Date of Patent: Sep. 3, 1985

[54] MAGNETIC FEEDTHROUGH CANCELLING SURFACE ACOUSTIC WAVE DEVICE

[75] Inventors: Grantley O. Este, Stittsville; Mark S. Suthers, Lanark; Richard W. Streater, Nepean, all of Canada

[73] Assignee: Northern Telecom Limited, Montreal, Canada

[21] Appl. No.: 567,332

[22] Filed: Dec. 30, 1983

[51] Int. Cl.$^3$ .............................................. H03H 9/25
[52] U.S. Cl. .................................. 310/313 B; 333/151
[58] Field of Search ................... 310/313 B; 333/151, 333/154, 196

[56] References Cited

U.S. PATENT DOCUMENTS 3,551,837  12/1970  Speiser et al. ...................... 333/154

FOREIGN PATENT DOCUMENTS 2132985  4/1980  Fed. Rep. of Germany ...... 333/151

Primary Examiner—Peter S. Wong
Assistant Examiner—Rebsch D. L.
Attorney, Agent, or Firm—Stuart L. Wilkinson

[57] ABSTRACT

A surface acoustic wave (SAW) device has an input interdigitated transducer (IDT) and an output IDT. One of the transducers is formed as two loops which are interconnected so that unwanted magnetic feedthrough voltages induced in or by such current loops cancel, while currents producing or produced by the SAW add.

20 Claims, 2 Drawing Figures

MAGNETIC FEEDTHROUGH CANCELLING SURFACE ACOUSTIC WAVE DEVICE

This invention relates to surface acoustic wave (SAW) devices.

As is well known, a SAW device comprises an input interdigitated transducer (IDT) and an output IDT which are arranged spaced apart on a piezoelectric substrate for propagation of a SAW between them. Such a SAW device may be used in the feedback path of an amplifier to constitute a delay line oscillator, the frequency of the oscillator being determined by the delay taken for the SAW to pass from the input transducer to the output transducer, and hence by the separation of the transducers. Other characteristics of the oscillator such as its bandwidth and frequency response are set by appropriate design of the transducers.

For a delay line oscillator operating at microwave frequencies, such as a microwave generator in radio transmission systems, the spacing of the input and output transducers of the delay line SAW device must be very small.

Ideally, the input and output transducers interact only to the extent that the one generates a SAW and the other receives it. However, each transducer essentially forms a loop conductor which generates magnetic flux near the loop as current passes through it. It has been found that for a SAW device in a microwave frequency delay line oscillator, the spacing between the input and output transducers is so small that magnetic flux generated within the input transducer loop generates a spurious current in the output transducer loop. This produces a noise signal which degrades the desired output signal producing a ripple in the pass band of typically 0.5 decibels. Typical specifications for SAW devices require a ripple of less than 0.2 decibels.

To overcome the magnetic feedthrough problem, there is proposed according to the present invention a surface acoustic wave (SAW) device comprising an input transducer and an output transducer, said input transducer operable to generate a SAW and a magnetic flux, one of the transducers having a plurality of loops interconnected such that at the output transducer, voltages induced by the magnetic flux substantially cancel and voltages produced by the SAW add.

The output transducer preferably has a plurality of loops connected in parallel such that magnetic flux generated by electrical current passing in the input transducer induces voltage of one polarity in one loop of the output transducer which is substantially cancelled by voltage of reversed polarity induced in the other loop or loops. Alternatively, the input transducer can have a plurality of loops connected in parallel such that magnetic flux generated by electrical current passing in one loop induces voltage of one polarity at the output transducer which is substantially cancelled by voltage of reverse polarity induced at the output transducer by a magnetic flux generated by electrical current passing in the other loop or loops of the input transducer.

The multiple loop transducer can have a pair of such loops, each loop including first and second voltage rails and a set of interdigitated electrodes or fingers extending between the rails. The loops can have voltage rails parallel to one another and interdigitated electrodes parallel to one another, the rails being perpendicular to the electrodes, the loops being closely adjacent to one another in a direction parallel to the electrodes and having closely adjacent voltage rails at a first voltage and remote voltage rails at a second voltage.

Particularly for use in a delay line oscillator, the magnetic feedthrough compensated arrangement permits the length of the transducers to be selected for highly efficient coupling from the input to the output transducer.

Embodiments of the invention will now be described by way of example, with reference to the accompanying drawings in which:

FIG. 1 marked PRIOR ART illustrates a known SAW device; and

Figure 2:
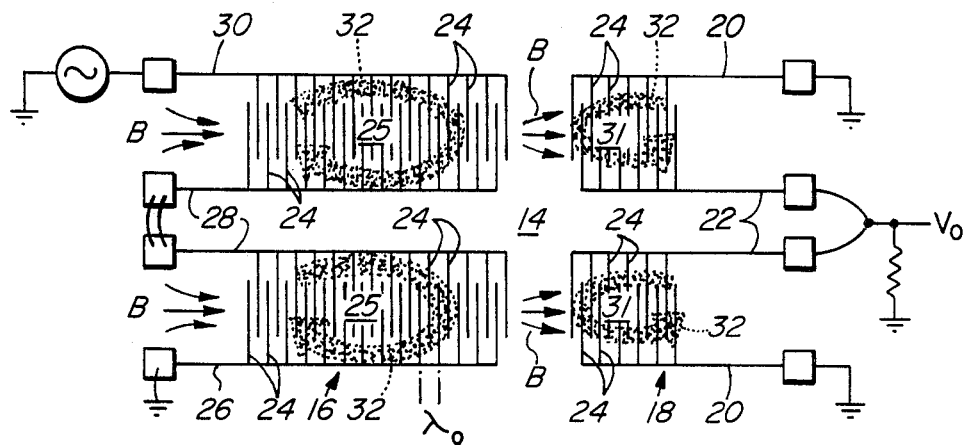
Figure 2:
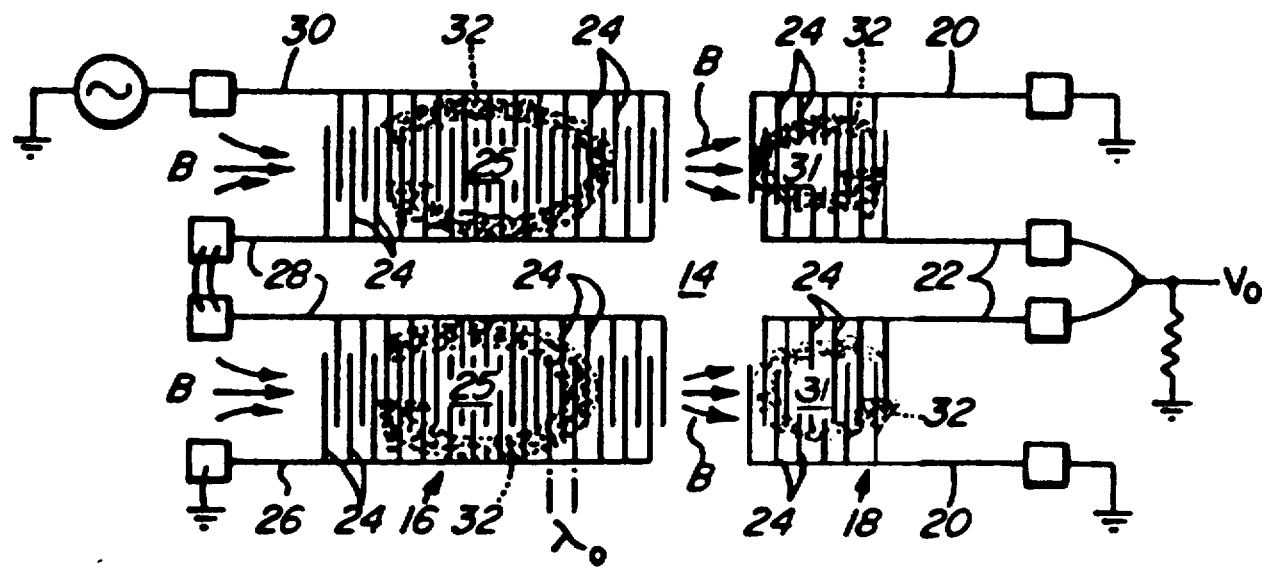

FIG. 2 is a schematic plan view, not to scale, of a SAW device according to the invention.

In a SAW delay line oscillator, location of the input and output transducers is dependent on the properties of the substrate material and the center frequency operation. A tyical known transducer arrangement is shown in FIG. 1 marked PRIOR ART, the SAW device shown having an input transducer 10 and an output transducer 12.

The delay through the device is determined by the spacing "s" between the centers of the two transducers 10 and 12. To ensure single frequency output, one of the transducers must have a length $N_1\lambda_0$ which is greater or equal to "s" where $N_1$ is the number of finger pairs in the input transducer 10 and $\lambda_0$ is the width of a finger or electrode pair 13. This imposes a limit on the maximum separation permitted between the transducers. For example, for an output frequency of 2 gigahertz $\lambda_0$ is 2.5 microns. Typical values of $N_1$ are in the range 100 to 200, signifying a transducer center-to-center spacing of 250 to 500 microns, which leaves a maximum of 125 to 250 microns spacing between IDTs if the output IDT were a single finger pair. For a number of reasons, the separation is much less, typically 60 to 125 microns.

With such a small spacing, magnetic flux generated within the input transducer 10 by current flowing through it can induce a voltage in the output transducer 12. This is detected as a high electromagnetic feedthrough which induces a ripple in the output transducer pass band and significantly degrades the output signal at microwave frequencies. Although coupling could be reduced by increasing IDT spacing, this is not practical in a SAW device used as a delay line oscillator since it causes multimode oscillation.

Referring to FIG. 2 in detail there is shown in plan view a magnetic feedthrough compensated SAW device. The device has a piezoelectric substrate 14 onto which are vacuum deposited patterns of aluminum comprising an input or transmitting transducer 16 and an output or receiving transducer 18.

The output transducer consists of outer voltage rails 20 which are grounded and central rails 22 from which an output signal is obtained. Between the voltage rails 22 and the rails 20 extend respective sets of interdigitated fingers or electrodes 24. The fingers 24 have a line width and spacing of nominally 1.6 microns, the electrode or finger arrangement of one set 31 being a mirror image of the other set about a central axis extending from the input to the output transducer.

The input transducer pattern is similar to the output transducer pattern, but a lower voltage rail 26 is connected to ground, central rails 28 are floating, and an input signal is applied to a top rail 30. The electrode or finger arrangement of one set 25 is an offset replication of the other set. The pattern of interdigitated fingers in the output transducer 18 extends over a length less than the pattern of interdigitated electrodes of the input transducer 16.

In use, high frequency AC voltage is applied to the input transducer voltage rail 30 so as to generate a stress or surface acoustic wave at the surface of the underlying piezoelectric quartz. The surface acoustic wave (SAW) propagates to the right as shown in FIG. 2 and, when it reaches the output transducer 18, a reverse piezoelectric action occurs and an output signal is generated at the voltage rails 22.

The electrode or finger pairs 24 provide capacitive coupling between the top and bottom voltage rails of respective sets 25 and 31. At any time, the currents within the top and bottom sets 25 of the input transducer are equal. Current flow can be conveniently represented as loops 32. The effect of current flow around the two loops 32 of the input transducer is to generate magnetic flux B in addition to a surface acoustic wave. Since the transducers 16 and 18 are very close, a corresponding voltage is induced by the magnetic flux at the output transducer 18. Since two identical but reversed finger sets 31 exist in the output transducer with the top rail 22 of the lower set connected to the bottom voltage rail 22 of the upper set, then induced current tends to flow in opposite directions around loops 32. In fact, relative to the common connection at the voltage rails 22, voltage at one polarity generated in the upper finger set is exactly cancelled by voltage of the opposite polarity generated in the lower finger set. Thus the voltages induced by current within the input transducer exactly cancel, whereas voltage produced in the two finger sets 31 by the surface acoustic wave add.

As mentioned previously, for a delay line oscillator in which this invention finds particular application, a single frequency output is achieved if the transducers 16 and 18 have a center-to-center spacing of about $N_1\lambda_0$ where $\lambda_0$ is the electrode pair spacing and $N_1$ is the number of electrode pairs in the longer transducer. Consequently, in order that the transducers are spaced apart, one of the transducers must be longer than the other. This characteristic of the device mitigates against the high coupling efficiency of the FIG. 1 PRIOR ART SAW device. To obtain maximum untuned coupling between the IDTs, it is necessary to make the expression $1/\omega_0 C_T$ for both the input and output transducers equal to $50\Omega$, where $\omega_0$ is the center frequency and $C_T$ is the IDT interelectrode capacitance. Now $C_T$ is dependent on the number N of finger pairs 24 in the transducers. The input transducer, which essentially has series-connected finger sets has a capacitance $C_{T1}/2$ where $C_{T1}$ is the capacitance of one finger set of the IDT. The output transducer, which essentially has parallel connected finger sets, has a capacitance $2C_{T2}$ where $C_{T2}$ is the capacitance of one finger set of the IDT. By ensuring that both expressions $2/\omega_0 C_{T1}$ and $1/\omega_0 2C_{T2}$ equal $50\Omega$, then $C_{T1}/2$ equals $2C_{T2}$ or $C_{T1}$ equals $4 C_{T2}$.

Since periodicity and apertures are the same for both transducers, then maximum untuned coupling is achieved if the long, input transducer 16 has four times as many fingers 24 as does the short, output transducer 18; i.e. $N_1 = 4 N_2$. This satisfies the requirement that the short IDT must occupy less space than the long IDT and simultaneously allows the condition $1/\omega_0 C_T = 50\Omega$ to be met.

As shown in the FIG. 2 embodiment, the input and output transducers each have a pair of central voltage rails respectively 22 and 28. Each pair of rails can, alternatively be deposited as a single voltage rail.

Because of the interconnection to the input and output transducers, there are two current loops 32 in the output transducer 12 whereas in fact, in the input transducer 10 there is a single loop, since the central voltage rails 28 are floating. Consequently, the central rails 28 of the input transducer can be dispensed with altogether. As in the FIG. 2 embodiment, the induced voltages are perfectly equal and opposite, so they cancel at the output transducer. However, because of the difference in IDT aperture, maximizing coupling may be harder to achieve.

The embodiment of FIG. 2 shows an output transducer having a single pair of identical loops. In fact the output transducer can have several such loops so long as voltage induced in any one loop is cancelled by voltages induced within the other loops.

Also, although in the embodiment of FIG. 2, it is the output transducer which is split into separate loops 32, magnetic feedthrough suppression can be achieved by instead dividing the input transducer into two or more parallel connected compensating loops and changing interconnection in the output transducer to connect the finger sets in series. In this case, voltage induced in the output transducer by magnetic flux in any one input loop is cancelled by voltages induced by magnetic flux generated within the other input loops.

Although not forming a specific feature of this invention, it will be recognized that the pattern of interdigitation, the apodization or electrode overlap in the interdigitated zones, the electrode thickness and the electrode spacing, 11 can be varied depending on the particular desired response of the SAW device.

One example of SAW device, having a fifth spacial harmonic interdigitated input and output transducer pattern with a 1.0 micron line width and spacing on a single crystal quartz substrate has been used in the fabrication of a filter or oscillator having a central frequency of 2.06 GHz. Typically magnetic feedthrough of $-20$ dB for SAW coupling is suppressed to $-50$ dB using the compensating arrangement.

The response of the SAW device depends both on the nature of the electrode pattern and on the mechanical properties of the underlying substrate material. The aluminum of the interdigitated electrode is typically deposited to a depth of 50 nanometers whereas the voltage rails can be much thicker of the order of 500 nanometers. The loops of the output transducer are mirror images of each other, being identical both in respect of the interdigitated pattern and in the position and dimensions of the voltage rails and pads. It is not sufficient for only the interdigitated electrode arrangements to be balanced since magnetic flux effecting the output response is generated throughout the loops.

However, symmetry of transducer loop configuration may not be absolutely necessary in order to obtain a magnetic flux compensated arrangement. Thus a single input interdigitated transducer consisting of a single set of interdigitated fingers can have an associated current loop in which a part of the voltage rail is configured to introduce a second compensating current loop. Although a symmetrical arrangement is preferred, there seems no reason why a multiple looped asymmetric arrangement cannot also provide magnetic feedthrough cancellation.

What is claimed is:

1. A surface acoustic wave (SAW) device comprising an input transducer and an output transducer, the input transducer connected to a first reference potential point and to an input signal potential point, the output transducer connected to a second reference potential point and to an output signal potential point, one of the transducers having a plurality of loops, said input transducer functioning on application of an oscillatory signal at its signal potential point to generate a SAW and a magnetic flux, the SAW and the magnetic flux functioning to generate SAW induced voltage and magnetic flux induced voltage at the output transducer, both induced voltages having components corresponding to respective loops, the loops of said one transducer being so connected to one another and to the reference and signal potential points of said one transducer that at the output transducer signal potential point, the components of the magnetic flux induced voltage substantially cancel and the components of the SAW induced voltage add.

2. A SAW device as claimed in claim 1 in which the output transducer has a plurality of loops connected in parallel, each loop having a first terminal connected to the reference potential and a second terminal connected to the output signal potential point, the loops configured such that magnetic flux generated by eletrical current passing in the input transducer induces voltage components in the loops of the output transducer which substantially cancel at the output signal potential point.

3. A SAW device as claimed in claim 1 in which the input transducer has a plurality of loops, each loop having a first terminal connected to the reference potential and a second terminal connected to the input signal potential point, the loops configured such that magnetic flux generated by eletrical current passing in the loops induces voltage components at the output transducer which substantially cancel at the output signal potential point.

4. A SAW device as claimed in claim 2 in which the input transducer has a plurality of loops connected in series.

5. A SAW device as claimed in claim 3 in which the output transducer has a plurality of loops connected in series.

6. A SAW device as claimed in claim 5, each of the series connected loops having a pair of voltage rails parallel to one another and interdigitated electrodes parallel to one another, the rails being perpendicular to the electrodes, the loops being closely adjacent to one another in a direction parallel to the electrodes and having closely adjacent voltage rails interconnected and remote voltage rails at voltages different from one another.

7. A SAW device as claimed in claim 2, the output transducer having two parallel connected loops which are mirror images of one another located on opposite sides of a device central axis extending from the input to the output transducer.

8. A SAW device as claimed in claim 4, the input transducer having two series connected loops, identical to one another, and disposed on opposite sides of a device central axis extending from the input to the output transducer.

9. A SAW device as claimed in claim 2 each of the parallel connected loops having a pair of voltage rails parallel to one another, and interdigitated electrodes parallel to one another, the rails being perpendicular to the electrodes, the loops being closely adjacent to one another in a direction parallel to the electrodes and having closely adjacent voltage rails at a first voltage and remote voltage rails at a second voltage.

10. A SAW device as claimed in claim 4, each of the series connected loops having a pair of voltage rails parallel to one another and interdigitated electrodes parallel to one another, the rails being perpendicular to the electrodes, the loops being closely adjacent to one another in a direction parallel to the electrodes and having closely adjacent voltage rails interconnected and remote voltage rails at voltages different from one another.

11. A SAW device as claimed in claim 4 in which the input transducer has a length which is four times the length of the output transducer.

12. A SAW device as claimed in claim 1, the device having a piezoelectric substrate.

13. A SAW device as claimed in claim 1, the device having a passive substrate and a piezoelectric film deposited thereon.

14. A SAW device as claimed in claim 1 in which the transducers are interdigitated transducers (IDT).

15. A SAW device as claimed in claim 3 in which each transducer has two loops.

16. A SAW device as claimed in claim 4 in which each transducer has two loops.

17. A SAW device as claimed in claim 5 in which each transducer has two loops.

18. A SAW device as claimed in claim 3, the input transducer having two parallel connected loops which are mirror images of one another located on opposite sides of a device central axis extending from the input to the output transducer.

19. A SAW device as claimed in claim 5, the output transducer having two series connected loops, identical to one another, and disposed on opposite sides of a device central axis extending from the input to the output transducer.

20. A SAW device as claimed in claim 3, each of the parallel connected loops having a pair of voltage rails parallel to one another, and interdigitated electrodes parallel to one another the rails being perpendicular to the electrodes, the loops being closely adjacent to one another in a direction parallel to the electrodes and having closely adjacent voltage rails at a first voltage and remote voltage rails at a second voltage.

* * * * *

UNITED STATES PATENT AND TRADEMARK OFFICE
CERTIFICATE OF CORRECTION

PATENT NO. : 4,539,502

DATED : September 3, 1985

INVENTOR(S) : Grantley O. ESTE, Mark S. SUTHERS, Richard W. STREATER

It is certified that error appears in the above-identified patent and that said Letters Patent is hereby corrected as shown below:

In the drawings, Figure 2 should be replaced with the following figure...

Signed and Sealed this

Eleventh Day of February 1986

[SEAL]

Attest:

Attesting Officer

DONALD J. QUIGG

Commissioner of Patents and Trademarks